United States Patent
Kramer et al.

(10) Patent No.: US 8,470,631 B2
(45) Date of Patent: Jun. 25, 2013

(54) METHOD FOR MANUFACTURING CAPPED MEMS COMPONENTS

(75) Inventors: Torsten Kramer, Wannweil (DE);
Kathrin Knese, Reutlingen (DE);
Hubert Benzel, Pliezhausen (DE);
Karl-Heinz Kraft, Herrenberg (DE);
Simon Armbruster, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 553 days.

(21) Appl. No.: 12/727,978

(22) Filed: Mar. 19, 2010

(65) Prior Publication Data

US 2010/0267183 A1    Oct. 21, 2010

(30) Foreign Application Priority Data

Apr. 20, 2009   (DE) .................. 10 2009 002 485

(51) Int. Cl.
*H01L 21/00*      (2006.01)
(52) U.S. Cl.
USPC ............. 438/53; 438/127; 438/421; 438/456; 438/458
(58) Field of Classification Search
USPC .................. 438/127, 411, 421, 456, 458, 460
See application file for complete search history.

(56) References Cited

U.S. PATENT DOCUMENTS

| 6,106,735 | A | * | 8/2000 | Kurle et al. | 216/2 |
| 2005/0087843 | A1 | * | 4/2005 | Benzel et al. | 257/620 |
| 2008/0029863 | A1 | * | 2/2008 | Eskridge et al. | 257/678 |

FOREIGN PATENT DOCUMENTS

DE      103 50 036      5/2005

* cited by examiner

*Primary Examiner* — Zandra Smith
*Assistant Examiner* — Pamela E Perkins
(74) *Attorney, Agent, or Firm* — Kenyon & Kenyon LLP

(57) ABSTRACT

A simple and economical method for manufacturing very thin capped MEMS components. In the method, a large number of MEMS units are produced on a component wafer. A capping wafer is then mounted on the component wafer, so that each MEMS unit is provided with a capping structure. Finally, the MEMS units capped in this way are separated to form MEMS components. A diaphragm layer is formed in a surface of the capping wafer by using a surface micromechanical method to produce at least one cavern underneath the diaphragm layer, support points being formed that connect the diaphragm layer to the substrate underneath the cavern. The capping wafer structured in this way is mounted on the component wafer in flip chip technology, so that the MEMS units of the component wafer are capped by the diaphragm layer. The support points are then cut through in order to remove the substrate.

5 Claims, 5 Drawing Sheets

METHOD FOR MANUFACTURING CAPPED MEMS COMPONENTS

FIELD OF THE INVENTION

The present invention relates to a method for manufacturing capped MEMS (Micro-Electro-Mechanical System) components, in which a large number of MEMS units are produced on a component wafer, in which a capping wafer is then mounted on the component wafer, so that each MEMS unit is provided with a cap structure, and in which the MEMS units capped in this way are finally separated to form MEMS components.

BACKGROUND INFORMATION

In many applications, MEMS components must be operated under precisely defined environmental conditions. For this reason, for example micromechanical rotational rate sensors and acceleration sensors are enclosed in a protective gas and at a prespecified pressure. In practice, for this purpose a cap is mounted on the chip surface over the micromechanical sensor structure. In order to produce a reliable pressure-tight connection between the cap and the chip surface, in most cases a bonding method is used. As a rule, the capping takes place on the wafer level, i.e. before the separation of the components, the cap structures also still being situated in the wafer composite. Capping wafers are typically structured using a small number of manufacturing steps. For example, recesses are often made in the wafer surface that, after assembly, each form a hollow space over the micromechanical structure of a component. A standard silicon wafer is typically used as a capping wafer. The thickness of such a wafer is, given a diameter of 150 mm, between 500 and 650 µm, and given a diameter of 200 mm is approximately 750 µm. Thinner wafers cannot be used in standard semiconductor manufacturing lines, because they do not have sufficient mechanical stability.

As a rule, the wafer stack made up of the component wafer and the capping wafer is thinned after the mounting of the capping wafer and before the separation, in order to reduce the constructive height of the MEMS components capped in this way. In practice, this is accomplished by mechanical wear, using grinding. In order to produce very thin components such as those required in consumer electronics, both the component wafers and the capping wafers have to be thinned, which is very expensive. In addition, the mechanical wearing away of material always entails the risk that the mechanical structure of the components will be damaged.

German Patent No. DE 103 50 036 describes a method for separating very thin semiconductor chips produced within a functional layer on a wafer substrate. According to this method, underneath the functional layer hollow spaces are made in the substrate so that the functional layer remains connected to the substrate underneath the hollow spaces only via support points. Here, the separation of the semiconductor chips takes place in two steps. In a first step, the functional layer is structured in such a way that the individual semiconductor chips remain connected to the substrate, and held in the wafer composite, only via the support points. The semiconductor chips are not separated from the substrate, by breaking the support points, until the second step.

SUMMARY OF THE INVENTION

The present invention provides a simple and economical method for manufacturing very thin capped MEMS components.

According to the present invention, for this purpose a diaphragm layer is formed in a surface of the capping wafer by using a surface micromechanical method to produce at least one cavern underneath the diaphragm layer, support points being formed that connect the diaphragm layer to the substrate underneath the cavern. The capping wafer structured in this way is then mounted on the component wafer using flip chip technology, so that the MEMS units of the component wafer are capped by the diaphragm layer. Only after this has been done are the support points cut through in order to remove the substrate.

The method according to the present invention enables the production of very thin to ultrathin cap structures in a diaphragm layer of the capping wafer, without requiring a grinding process for the thinning of the capping wafer. In addition, the method according to the present invention enables the mounting of such thin cap structures on the chip surface of MEMS components. For this purpose, the method according to the present invention exclusively uses known surface micromechanical processes and known assembly techniques that can easily be integrated into the process of manufacturing MEMS components. Thus, the diaphragm layer of the capping wafer, or the cavern under the diaphragm layer, is for example produced using por-Si technology, as described in German Patent No. DE 103 50 036. The handling of the diaphragm layer, in particular during mounting, is simplified in that the diaphragm layer at first remains connected to the substrate of the capping wafer via support points. This support point connection of the diaphragm layer to the substrate of the capping wafer enables on the one hand a mounting using flip-chip technology, and on the other hand also enables the use of standard connection techniques such as anodic bonding or sealing glass bonding or eutectic bonding, with which a reliable and pressure-tight connection can be produced between the component wafer and the diaphragm layer of the capping wafer. The support points are configured in such a way that the diaphragm layer is connected fixedly to the substrate of the capping wafer both during a possible processing and during mounting on the component wafer. At the same time, however, the holding forces of the support points are small enough that the support points form intended breakage points for the removal of the substrate after the mounting of the diaphragm layer on the component wafer. This removal can take place either before the separation process, i.e. at the wafer level, or may also take place after the separation process, i.e. at the chip level.

In an advantageous development of the method according to the present invention, the surface of the capping wafer is also structured in order to form a large number of cap structures in the diaphragm layer, corresponding to the number of MEMS units on the component wafer. Thus, for example for each MEMS unit a recess can be produced in the diaphragm layer if a hollow space is to be enclosed between the chip surface and the cap structure. Moreover, through corresponding structuring of the diaphragm layer the contours of the individual cap structures can be transferred to the diaphragm layer in order to simplify the separation process. In the context of such a structuring, the cap structures can already be exposed to such an extent that they are held in the wafer composite only via the support points. In this case, it is then necessary only to cut through the component wafer in order to separate the MEMS components capped in the wafer composite.

In addition, electronic circuit elements can be integrated into the surface of the capping wafer, i.e. into the diaphragm layer, in order to also equip the cap structures with an electronic functionality (so-called IC cap). Such a circuit arrangement is advantageous not only with regard to a miniaturization of the MEMS components, but also with regard to the use of these capped MEMS components in an aggressive environment. Because the capping wafer and the component wafer are mounted face-to-face, the circuit elements are situated in the interior and are correspondingly protected against environmental influences.

As already mentioned, the support points between the diaphragm layer and the substrate of the capping wafer are cut through after mounting on the component wafer in order to remove the substrate. In an advantageous variant of the method according to the present invention, for this purpose pressurized air is blown in between the diaphragm layer and the substrate of the capping wafer. However, the support points may also be broken using a water jet.

DETAILED DESCRIPTION

Figure 1A:
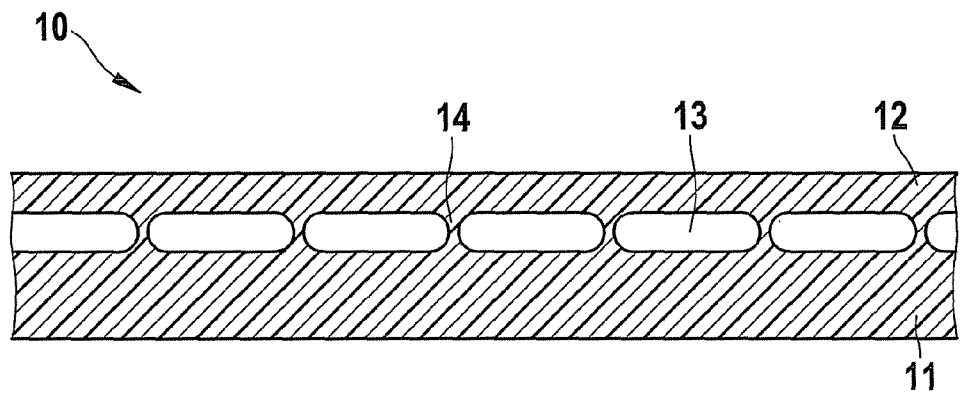
FIGS. 1a through 1f illustrate the individual steps of the method according to the present invention for manufacturing capped MEMS components on the basis of schematic sectional representations.

FIG. 1a first shows only one capping wafer 10. In the upper side of capping wafer 10, a diaphragm 12 is formed that spans a whole-surface cavern 13 in capping wafer 10. Diaphragm 12 is connected via support points 14 to substrate 11 underneath cavern 13. The support points can be shown for example in the form of webs or columns. A por-Si diaphragm wafer can advantageously be used as capping wafer 10. It is known that por-Si diaphragm wafers having large-surface diaphragms can be used to manufacture ultra-thin IC chips. The diaphragm thickness of such por-Si diaphragm wafers is in a range between a few pm and several hundred pm, and can easily be specified by the epitaxy process that forms the diaphragm. Correspondingly, the diaphragm thickness of a por-Si diaphragm wafer can also easily be adapted to the particular mechanical requirements of a capping structure.

Figure 1B:
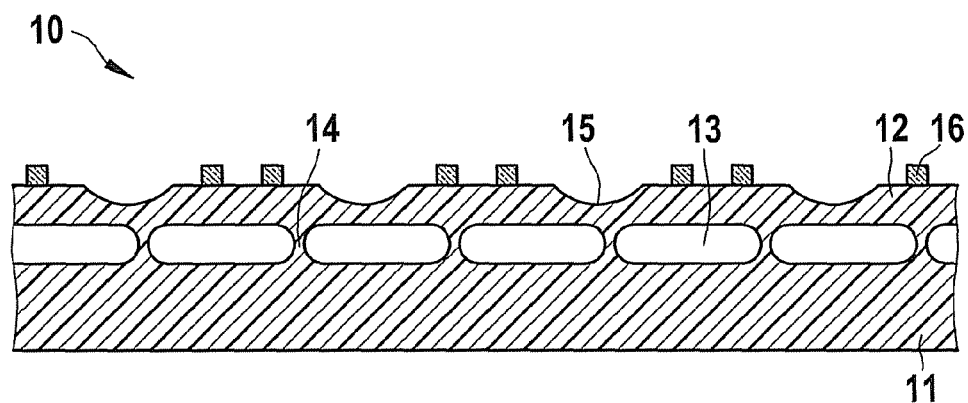

FIG. 1b shows capping wafer 10 after a structuring of the upper side in which a large number of recesses 15 have been produced in diaphragm 12. In the case of a por-Si diaphragm wafer, the upper side structuring can easily be realized using standard processes of semiconductor technology. Moreover, bonding webs 16 made of sealing glass are applied onto the structured upper side of capping wafer 10 in order to bond capping wafer 10 face-to-face with a component wafer.

Figure 1C:
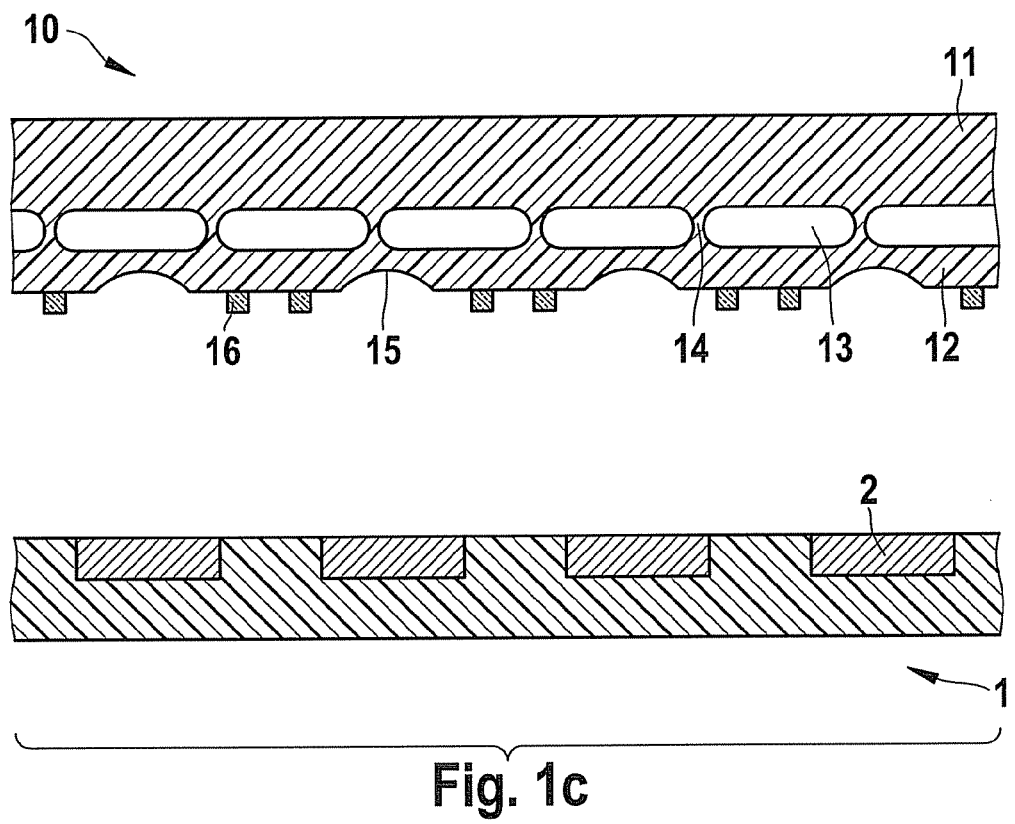

The mounting of capping wafer 10 prepared in this way takes place in flip-chip technology, as is illustrated in FIG. 1c. Here, underneath rotated capping wafer 10 a component wafer 1 is shown having a large number of MEMS units 2. The situation and dimensioning of recesses 15 in diaphragm layer 12 is matched to the situation and dimensions of MEMS units 2 on component wafer 1.

Figure 1D:
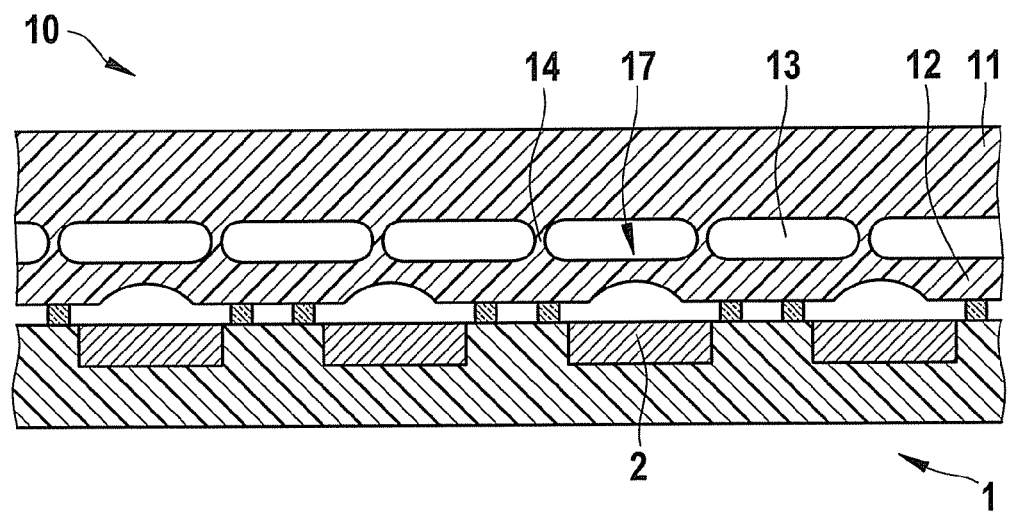

FIG. 1d shows component wafer 1 after the mounting of capping wafer 10. Here, each MEMS unit 2 of component wafer 1 has been provided with a capping structure 17, each capping structure 17 being formed by a region of diaphragm layer 12 having a recess 15. As already indicated, here sealing glass bonding was used as an assembly technique. Because bonding webs 16 are each situated peripherally in the edge area of capping structures 17, each individual capping structure 17 is connected in pressure-tight fashion to the chip surface of the corresponding MEMS unit 2.

Figure 1E:
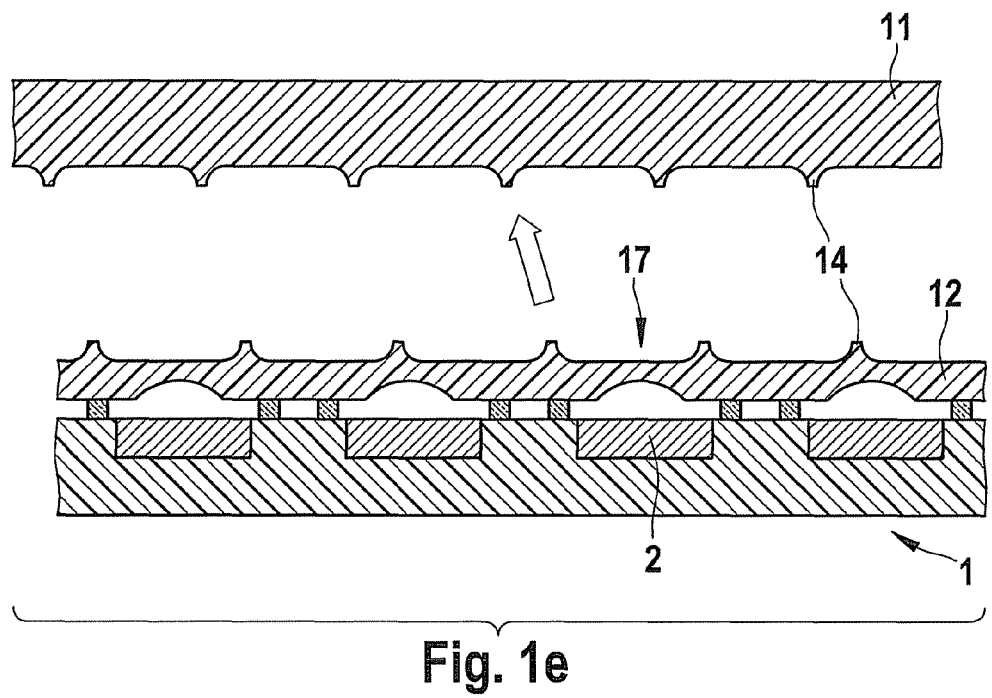

In the exemplary embodiment shown here, substrate 11 of capping wafer 10 is removed after mounting on component wafer 1, as is illustrated in FIG. 1e. For this purpose, support points 14 between diaphragm layer 12 and substrate 11 of capping wafer 10 are cut through. The simplest way to do this is by tearing them off using a pick-off tool. The breaking of support points 14 can be supported for example by blowing in pressurized air (or some other gaseous medium) between diaphragm layer 12 and substrate 11, or also using water jet nozzles (or some other liquid medium). This does not adversely affect the functionality of diaphragm layer 12 or of capping structures 17, which are connected fixedly to the upper side of component wafer 1. Removed substrate 11 of capping wafer 10 can be reused if warranted.

Figure 1F:
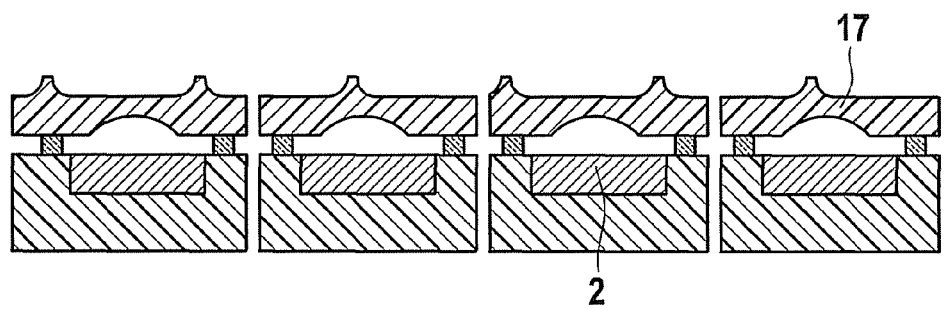

There now takes place the separation of MEMS units 2 provided with capping structures 17, as shown in FIG. 1f. For this purpose, standard methods may also be used in which component wafer 1 is cut through together with diaphragm layer 12.

In the method variant shown in FIGS. 2a through 2e as well, a capping wafer 20 having a large number of capping structures 27 is mounted on a component wafer 1 having a large number of MEMS units 2, each MEMS unit 2 being provided with a capping structure 27. Only then are the MEMS units capped in this way separated.

Figure 2A:
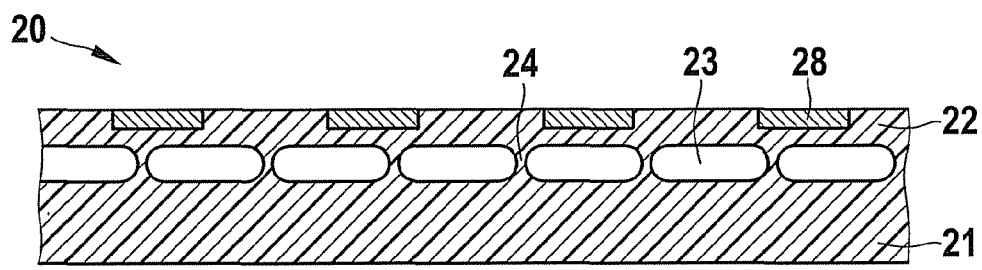
FIGS. 2a through 2e illustrate the individual steps of a variant of the method according to the present invention, also on the basis of schematic sectional representations.

As in the case of FIG. 1a, in FIG. 2a as well, at first only capping wafer 20 is shown, in whose upper side a whole-surface diaphragm 22 is formed. This diaphragm spans a cavern 23 and is connected via support points 24 to substrate 21 underneath cavern 23. In addition to its mechanical function, namely the encapsulation of a MEMS unit, here each capping structure 27 is also equipped with an electrical functionality in the form of electronic circuit elements 28. In this context as well, the use of a por-Si diaphragm wafer as a capping wafer proves to be advantageous, because por-Si diaphragm wafers are easy to process in a standard IC production line, in order for example to produce ASIC circuits 28 in the diaphragm surface.

Figure 2B:
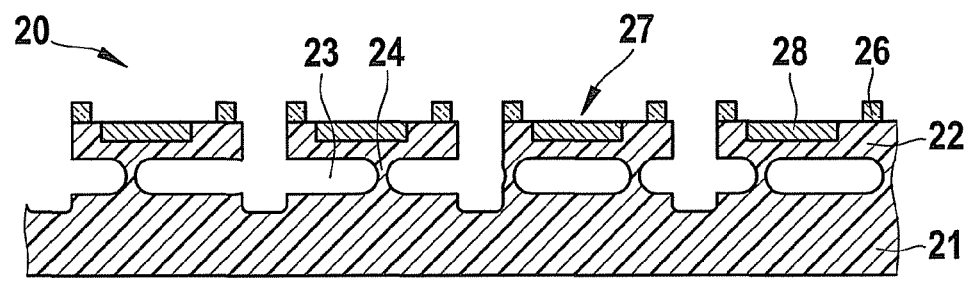

In the exemplary embodiment described here, diaphragm layer 22 is structured in order to separate capping structures 27 in the geometry required for each of the MEMS units 2. Advantageously, this structuring of diaphragm layer 22 takes place using a deep trench process that at most affects substrate 21, so that individual capping structures 27 are still held in the wafer composite at least via support points 24. This is shown in FIG. 2b. As already described in the case of the exemplary embodiment described in connection with FIGS. 1a through 1f, the mounting of capping wafer 20 on component wafer 1 takes place using sealing glass bonding. For this purpose, each capping structure 27 is provided with a peripheral sealing edge 26.

Figure 2C:
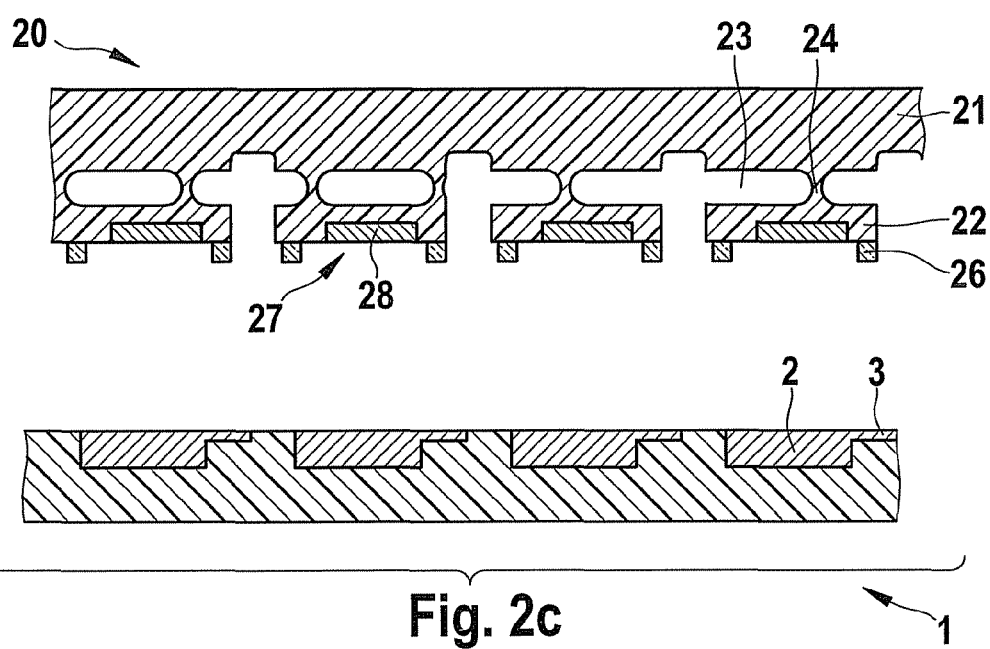
Figure 2D:
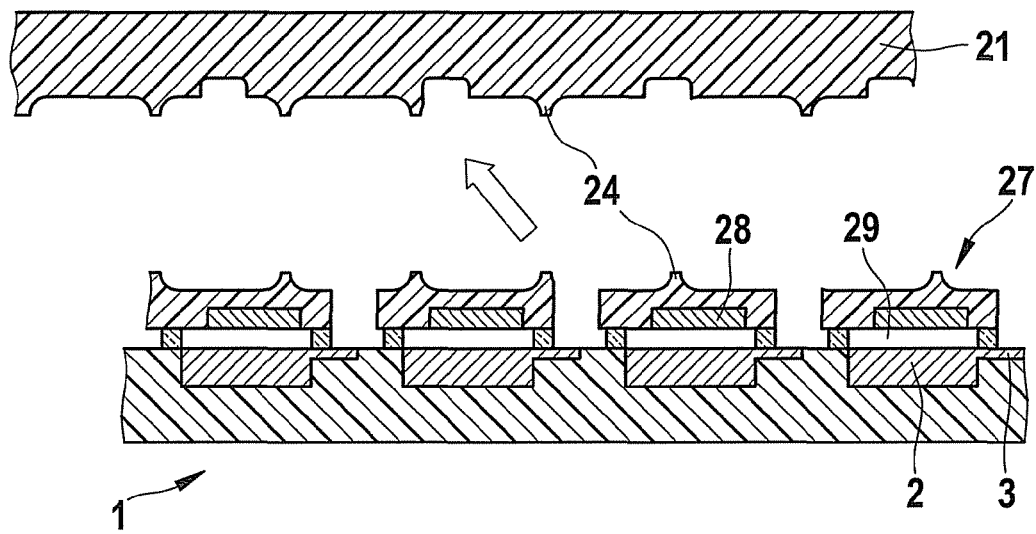

FIG. 2c illustrates the mounting of capping wafer 20 prepared in this way in flip-chip technology, i.e. face-to-face with component wafer 1. Here, the electrically active upper side of capping wafer 20 is oriented in the direction of the upper side that is to be capped of component wafer 1.

Correspondingly, after the mounting MEMS units 2 and ASIC circuits 28 are each situated inside hollow space 29 between capping structure 27 and the chip surface. This hollow space 29 is hermetically sealed by sealing edge 26. Here, the electrical contacting between MEMS unit 2 and capping ASIC 28 of the components is not shown separately, but can easily be integrated into MEMS units 2 and ASICs 28. Terminal contacts 3 for the overall MEMS component are here each formed in the chip surface of MEMS unit 2. Correspondingly, capping structures 27 are dimensioned in such a way that terminal contacts 3 of a component are accessible from the outside, which is illustrated in particular in FIG. 2d. This Figure shows component wafer 1 after the mounting of capping wafer 20 and after the removal of substrate 21. For this purpose, support points 24 between the already-separated capping structures 27 and substrate 21 were simply cut through.

Figure 2E:
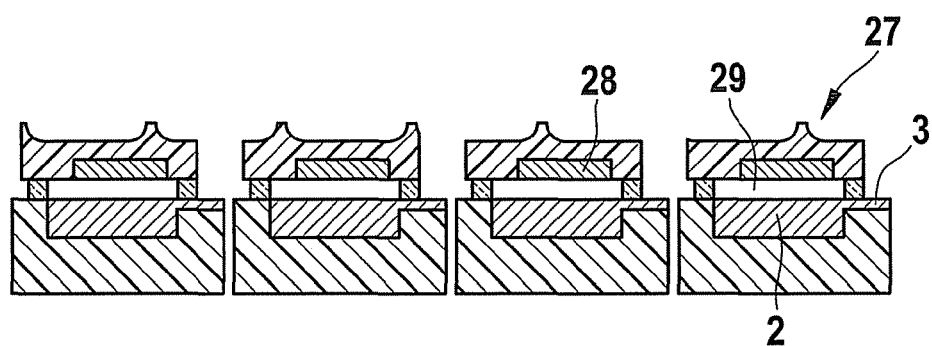

In the present case, it then remains only to disconnect component wafer 1 in order to separate the capped MEMS units 2, as is shown in FIG. 2e.

Exactly as does FIG. 1f, FIG. 2e illustrates that the remnants of the support points, between the diaphragm layer and the substrate of the capping wafer can still be seen in the finished MEMS component, providing evidence of the manufacturing method according to the present invention.

The exemplary embodiments explained above illustrate that the method according to the present invention is compatible with standard semiconductor processes, and in particular also with standard MEMS processes. Using the method according to the present invention, components can easily be realized having caps that are uniformly thin, and in particular also ultrathin, their thickness being determined exclusively in accordance with the mechanical requirements for the cap. Because the excess substrate material of the capping wafer on a piece is removed, the method according to the present invention is very effective and economical. Moreover, the wafer stack is exposed only to very slight mechanical loading. There is a correspondingly small risk of mechanical damage to the MEMS components, and the concomitant yield losses. Moreover, the method according to the present invention offers the possibility of reuse of the separated capping wafer substrate.

What is claimed is:

1. A method for manufacturing capped MEMS (Micro-Electro-Mechanical System) components, comprising:

producing a plurality of MEMS units on a component wafer;

mounting a capping wafer on the component wafer, so that each MEMS unit is provided with a capping structure;

separating the capped MEMS units to form MEMS components;

providing a diaphragm layer in a surface of the capping wafer by producing, using a surface micromechanical method, at least one cavern underneath the diaphragm layer;

forming support points that connect the diaphragm layer to a substrate underneath the cavern;

mounting the capping wafer on the component wafer in flip-chip technology, so that the MEMS units of the component wafer are capped by the diaphragm layer; and subsequently cutting-through the support points in order to remove the substrate.

2. The method according to claim 1, further comprising structuring the surface of the capping wafer, a recess being produced for each MEMS unit and/or contours of individual capping structures being at least partly transferred into the diaphragm layer.

3. The method according to claim 1, further comprising integrating electronic circuit elements into the surface of the capping wafer, into individual capping structure regions of the diaphragm layer.

4. The method according to claim 1, further comprising bonding the capping wafer onto the component wafer, through sealing glass bonding, anodic bonding, or eutectic bonding.

5. The method according to claim 1, wherein the support points are broken by blowing in pressurized air between the diaphragm layer and the substrate of the capping wafer, or using a water jet.

* * * * *